Aug. 24, 1965 B. DIETRICH 3,202,940

SEMICONDUCTOR AMPLITUDE MODULATION CIRCUIT

Filed June 26, 1961

INVENTOR
BERNHARD DIETRICH

BY Francis L. Masselle

ATTORNEY

United States Patent Office 3,202,940
Patented Aug. 24, 1965

3,202,940

SEMICONDUCTOR AMPLITUDE MODULATION CIRCUIT

Bernhard Dietrich, Freiburt, Breisgau, Germany, assignor to Clevite Corporation, a corporation of Ohio Filed June 26, 1961, Ser. No. 119,684
Claims priority, application Germany, June 25, 1960, J 18,336
3 Claims. (Cl. 332—43)

Figure 1:
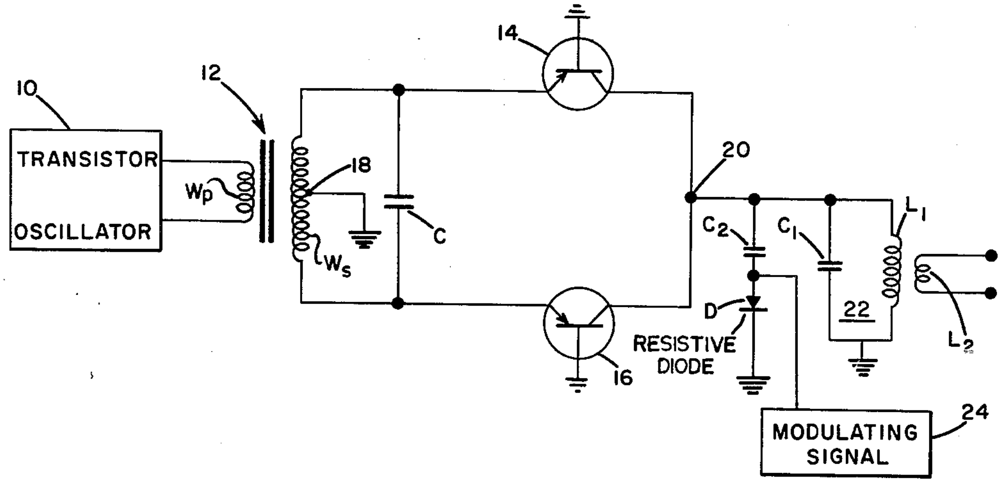

This invention relates to circuits for amplitude-modulated signal generators and transmitters comprising semiconductor circuit elements. Vacuum tube amplitude modulation circuits are known which employ an oscillator operating at a sub-harmonic of the carrier frequency, and the carrier frequency itself obtained by passing the oscillator output through a desired number of frequency doubling or multiplying stages. Customarily amplitude modulation of the carrier wave is effected at the power output stage either by applying the modulating signal to the control grid of the first power amplifier vacuum tube or by various other arrangements, e.g., plate modulation, screen grid modulation or the like. Where there are more than two vacuum tube stages separating the oscillator from the modulated stage, the modulating signal has little or no effect on the operation of the oscillator.

The same circuit arrangement, however, when used in transistorized transmitters results in the amplitude-modulated output signal having an undesirably large FM component. For example, in a transmitter having a quartz-crystal stabilized oscillator followed by five individual stages before the modulated stage, FM components as high as 25 percent have been measured in the output signal. Moreover, it proved impossible in such a circuit to keep the frequency-modulated component below 15 percent. With variable frequency oscillators the problem is even worse; in these it is difficult to keep FM components below 45 percent.

The root of the problem lies in the differences in operating characteristics between semiconductor amplifiers and rectifiers and their vacuum tube analogues. Ordinarily transistors are triodes and, therefore, are characterized by relatively high interelectrode reaction, particular capacitance. For example, if it is desired to modulate the collector current, the current flow through the transistor varies accordingly and with it the collector-emitter capacitance ($C_{ce}$). This variation in capacitance influences the operation of the oscillator even though separated by several stages from that at which the variation occurs. Consequently, frequency modulation is introduced in addition to the amplitude modulation.

It is the fundamental general object of the present invention to provide semiconductor modulating circuits which overcome or at least mitigate the problem outlined above.

More specifically, it is an object of the present invention to provide an amplitude-modulating circuit which keeps to a minimum unwanted frequency modulated components in the output signal.

A further object is the provision of an improved circuit for producing an amplitude-modulated output signal practically devoid of distortion due to frequency modulation.

These and additional objects are fulfilled by the circuits contemplated by the present invention which comprise a transistor oscillator; a bridge network coupled to the output of the oscillator; a tuned oscillatory circuit connected in a diagonal branch of the bridge; means coupled to the oscillatory circuit for deriving an output signal therefrom; and means for varying the Q of the oscillatory circuit in accordance with a modulating signal.

Figure 2:
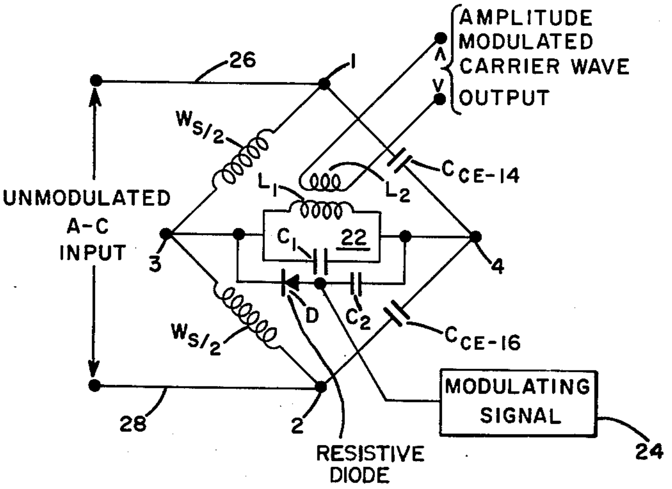

Further objects of the invention, its advantages, scope and the manner in which it may be practiced will be more fully apparent to persons conversant to the art from the following description and subjoined claims taken in conjunction with the annexed drawing in which like reference characters denote like parts throughout the several views and, FIGURE 1 is a schematic wiring diagram of a circuit for generating an amplitude modulated signal in accordance with the present invention; and FIGURE 2 is a schematic wiring diagram of the major part of the FIGURE 1 circuit re-drawn in the form of a bridge.

In FIGURE 1 reference numeral 10 designates a transistorized oscillator which is shown in block form and can be of any conventional design. Oscillator 10 may be constructed to generate either a fixed or variable frequency which, in any case, is a sub-multiple of the carrier frequency. A transformer 12 has a primary winding $W_p$ connected to the output of oscillator 10. A pair of transistor triodes 14 and 16 are connected in push-pull with a secondary winding $W_s$ of transformer 12. Specifically, the respective emitters of transistors 14 and 16 are connected to the ends of secondary winding $W_s$ which has a center tap 18 connected to a ground potential. The collector electrodes of transistors 14 and 16 are interconnected at a common point 20. The base of both the transistors is appropriately biased, for instance, by connection to ground, to establish the desired operation thereof for incorporation in the modulator of this invention.

A tuning capacitor C shunting the secondary winding of transformer 12 permits it to be tuned to the frequency of oscillator 10. The output from transistors 14, 16 is fed to a tank circuit 22 consisting of capacitor $C_1$ and coil $L_1$ connected in parallel between common point 20 and the ground potential. Tank 22 is designed to oscillate at the carrier frequency, which is a multiple of the output frequency of oscillator 10. An output signal is derived at terminals of a coil $L_2$, inductively coupled to coil $L_1$ of the tank.

The modulation system contemplated by the present invention is based on consideration of the fact that the amplitude of the oscillations of tank 22 depends on its quality factor or "Q." In accordance with the present invention the Q of tank 22 is varied by means of a variable resistive impedance connected in parallel with the tank. Thus, for example, a diode D is connected in series with a blocking capacitor $C_2$ between common point 20 and ground. A source 24 of the modulating signal voltage is connected to a point above diode D with respect to ground potential so that the potential difference across the diode and, therefore, its resistance varies in accordance with the modulating signal. Consequently, the Q of tank 22 and, concomitantly, the amplitude of the carrier frequency output varies in accordance with the modulating signal; amplitude modulation of the carrier wave is thus achieved without undue current changes in the collector circuits of transistors 14 and 16.

Another aspect of the circuit, insofar as concerns its ability to isolate oscillator 10 from the frequency effects of the modulating signal, will be more readily apparent from considering the circuit in the form of a bridge as shown in FIGURE 2. Opposite points of the bridge, designated 1 and 2, represent respective ends of secondary winding $W_s$ of transformer 12, FIGURE 1. Accordingly, conductors 26, 28 connected to points 1 and 2 represent means for applying an unmodulated A.-C. input voltage at a frequency which is a sub-multiple of the carrier frequency and which, in FIGURE 1, is accomplished by inductive coupling to transistor oscillator 10.

In the bridge, secondary winding $W_s$ of transformer 12 is divided equally between two adjacent branches having a common junction point 3 corresponding to tap 18 on the secondary transformer winding.

The branches of the bridge respectively opposite those containing the secondary winding segments $W_{s/2}$ comprise capacitors $C_{ce}$–14 and $C_{ce}$–16 representing the interelectrode capacitance of transistors 14 and 16.

Tank circuit 22 is connected diagonally across the bridge between points 3 and 4 and is shunted by the series combination of blocking capacitor $C_2$ and diode D. Output terminals for the modulated carrier wave are inductively coupled to the coil $L_1$ of tank circuit 22 and the modulating signal is applied across diode D in the manner already described.

It will be appreciated that the specific values of collector-emitter capacitances $C_{ce}$–14 and $C_{ce}$–16 are subject to adjustment by variation of the operating point of transistors 14, 16 and the specific values of inductances $W_{s/2}$ by adjustment of the tap on seconding winding $W_s$ of transformer 12. By such adjustments the bridge can be balanced so that there is no current flow in the diagonal branches. Consequently, there is no current flow in the bridge as a result of the voltage impressed between points 1 and 2. There is, of course, a voltage of the carrier frequency in tank circuit 22 in diagonal branch 3–4 of the bridge but this does not affect the input because of the balanced condition of the bridge. Application of the modulating signal results in variation of the collector-emitter voltage of transistors 14 and 16 and, consequently, the values of collector-emitter capacitance. However, inasmuch as the variations are in the same sense and the capacitances lie in respective adjacent branches of the bridge, the equilibrium of the bridge is maintained and there is no effect at the input terminals 1, 2 of the bridge.

While the circuit has been described as embodying transistors it will be appreciated that diodes may be substituted if desired. The bridge is balanced in the same manner, i.e., by adjustment of tap 18 on the transformer secondary $W_s$ or by changing the bias potential and, therefore, the capacitance of the diodes substituted for transistors 14, 16.

While there has been described what at present is believed to be the preferred embodiment of this invention, it will be obvious to those skilled in the art that various changes and modifications may be made therein without departing from the invention, and it is aimed, therefore, to cover in the appended claims all such changes and modifications as fall within the true spirit and scope of the invention.

What is claimed and desired to be secured by United States Letters Patent is:

1. An amplitude modulation circuit comprising: a transistor oscillator; a pair of semiconductor devices having rectifying junctions, coupled in push-pull relation to the output of said oscillator; a tuned LC oscillatory circuit coupled to said semiconductor devices; means coupled to said oscillatory circuit for deriving an output signal therefrom; and variable resistive impedance means responsive to a modulating signal for varying the Q of said LC oscillatory circuit to effect amplitude modulation of the output signal.

2. An amplitude modulation circuit comprising: a transistor oscillator; a transformer having a primary winding, connected across the output of said oscillator, and a tuned secondary winding inductively coupled to the primary winding; a pair of transistors having input and output electrodes connected in push-pull relation with said secondary winding; a center tap on said secondary winding; a tuned LC parallel circuit connected between said center tap and said transistor output electrodes; means for deriving an output signal from said tuned LC circuit; and circuit means, having a resistive impedance variable in response to an applied modulating signal, shunting said LC circuit for varying the Q of said LC circuit to effect amplitude modulation of the output signal.

3. An amplitude modulation circuit comprising: a transistor oscillator; a transformer having a primary winding, connected across the output of said oscillator, and a tuned secondary winding inductively coupled to the primary winding; a pair of semiconductor devices having input and output electrodes connected in push-pull relation with said secondary winding; a center tap on said secondary winding; a tuned LC parallel circuit connected between said center tap and said semiconductor device output electrodes; means for deriving an output signal from said LC circuit; and circuit means, having a resistive impedance variable in response to an applied modulating signal, shunting said LC circuit for varying the Q of said LC circuit to effect amplitude modulation of the output signal.

References Cited by the Examiner

UNITED STATES PATENTS

| | | | |
|---|---|---|---|
| 2,086,601 | 7/37 | Caruthers | 332—47 |
| 2,453,078 | 11/48 | Posthumus | 332—47 X |
| 2,562,640 | 7/51 | Reason | 332—43 |
| 2,832,051 | 4/58 | Raisbeck | 332—43 |
| 2,887,663 | 5/59 | Gates | 332—29 X |
| 3,101,452 | 8/63 | Holcomb et al. | 307—88.5 |

ROY LAKE, *Primary Examiner.*

ROBERT H. ROSE, ALFRED L. BRODY, *Examiners.*